(12) United States Patent
Wicker

(10) Patent No.: US 7,119,355 B2
(45) Date of Patent: Oct. 10, 2006

(54) LATERAL PHASE CHANGE MEMORY AND METHOD THEREFOR

(75) Inventor: Guy C. Wicker, Southfield, MI (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 11/042,522

(22) Filed: Jan. 25, 2005

(65) Prior Publication Data

US 2005/0142731 A1 Jun. 30, 2005

Related U.S. Application Data

(62) Division of application No. 10/319,204, filed on Dec. 13, 2002, now Pat. No. 6,867,425.

(51) Int. Cl.
*H01L 47/00* (2006.01)
*H01L 29/04* (2006.01)

(52) U.S. Cl. .......... 257/3; 257/4; 257/42; 257/E45.002; 438/102

(58) Field of Classification Search ................ 257/3; 438/102
See application file for complete search history.

(56) References Cited

U.S. PATENT DOCUMENTS

| | | | |
|---|---|---|---|
| 4,845,533 A | 7/1989 | Pryor et al. | 257/4 |
| 5,814,527 A | 9/1998 | Wolstenholme et al. | 438/5 |
| 6,111,264 A | 8/2000 | Wolstenholme et al. | 257/3 |
| 2002/0017701 A1 | 2/2002 | Klersy et al. | 257/536 |
| 2002/0187648 A1 | 12/2002 | Wu et al. | 438/745 |

*Primary Examiner*—Tu-Tu Ho
(74) *Attorney, Agent, or Firm*—Trop, Pruner & Hu, P.C.

(57) ABSTRACT

Briefly, in accordance with an embodiment of the invention, a lateral phase change memory and a method to manufacture a phase change memory is provided. The method may include forming a conductor material over a substrate and patterning the conductor material to form two electrodes from the conductor material, wherein the two electrodes are separated by a sub-lithographic distance. The method may further include forming a phase change material between the two electrodes.

10 Claims, 8 Drawing Sheets

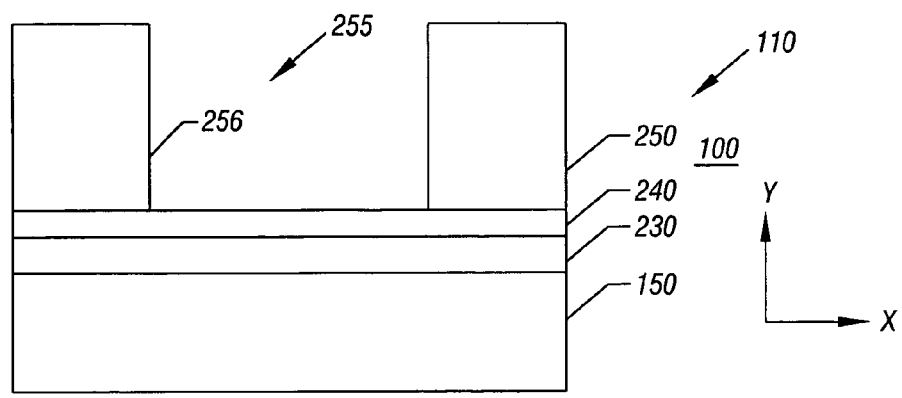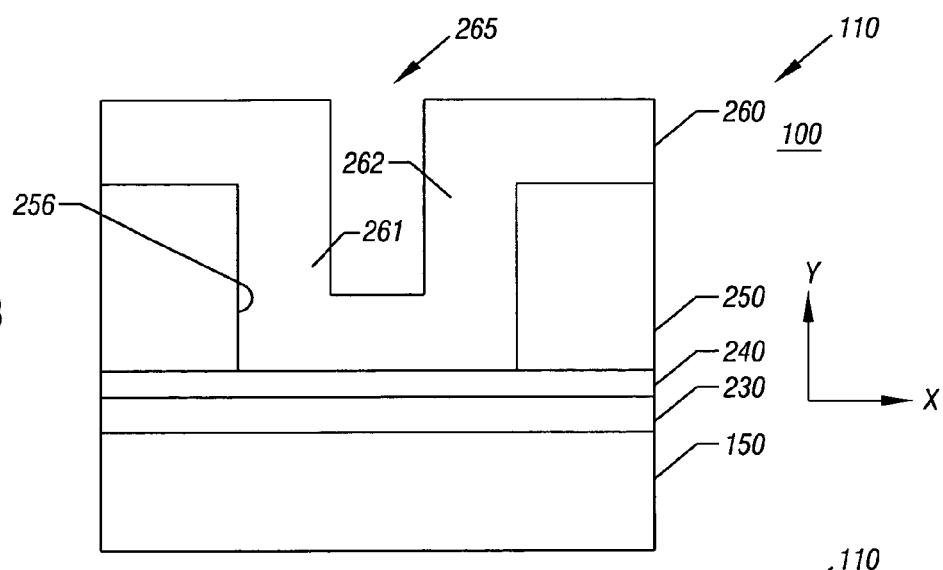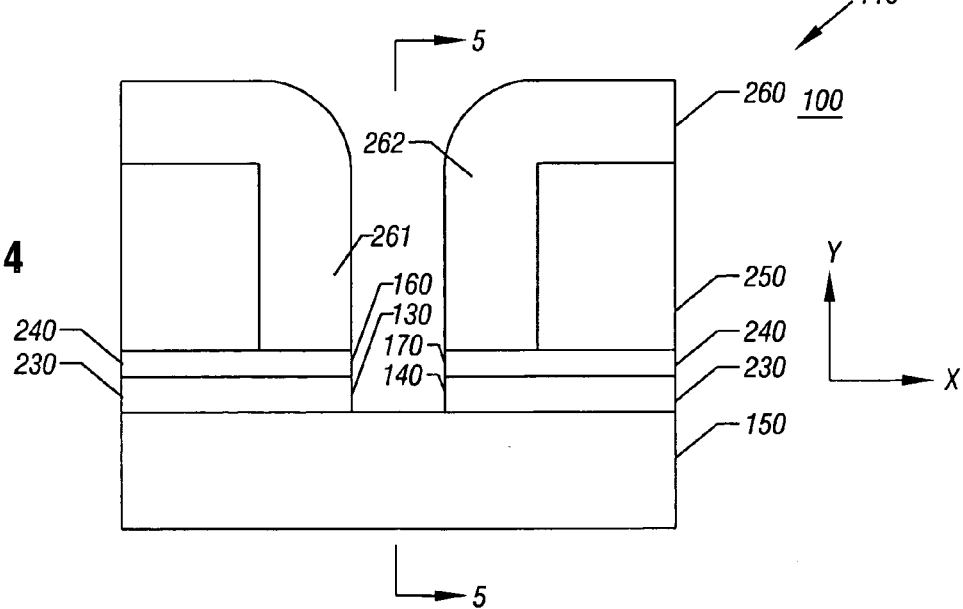

LATERAL PHASE CHANGE MEMORY AND METHOD THEREFOR

This application is a divisional of U.S. patent application Ser. No. 10/319,204, filed Dec. 13, 2002 now U.S. Pat. No. 6,867,425.

BACKGROUND

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states.

Typical materials suitable for such application include those utilizing various chalcogenide elements. The state of the phase change materials are also non-volatile in that, when set in either a crystalline, semi-crystalline, amorphous, or semi-amorphous state representing a resistance value, that value is retained until reset as that value represents a phase or physical state of the material (e.g., crystalline or amorphous).

Programming the phase change material to alter the phase or memory state of the material is accomplished by applying an electrical current through the material to heat the material. Reducing the current applied to the phase change material may be desirable to reduce power consumption of the memory device.

Thus, there is a continuing need for alternate ways to manufacture phase change memory devices to reduce the current used to program the phase change materials.

BRIEF DESCRIPTION OF THE DRAWINGS

The subject matter regarded as the invention is particularly pointed out and distinctly claimed in the concluding portion of the specification. The present invention, however, both as to organization and method of operation, together with objects, features, and advantages thereof, may best be understood by reference to the following detailed description when read with the accompanying drawings in which:

FIG. 2 is a cross-sectional view of the memory of FIG. 1 during fabrication in accordance with an embodiment of the present invention;

FIG. 3 is a cross-sectional view of the structure of FIG. 2 at a later stage of fabrication;

FIG. 4 is a cross-sectional view of the structure of FIG. 3 at a later stage of fabrication;

Figure 1:
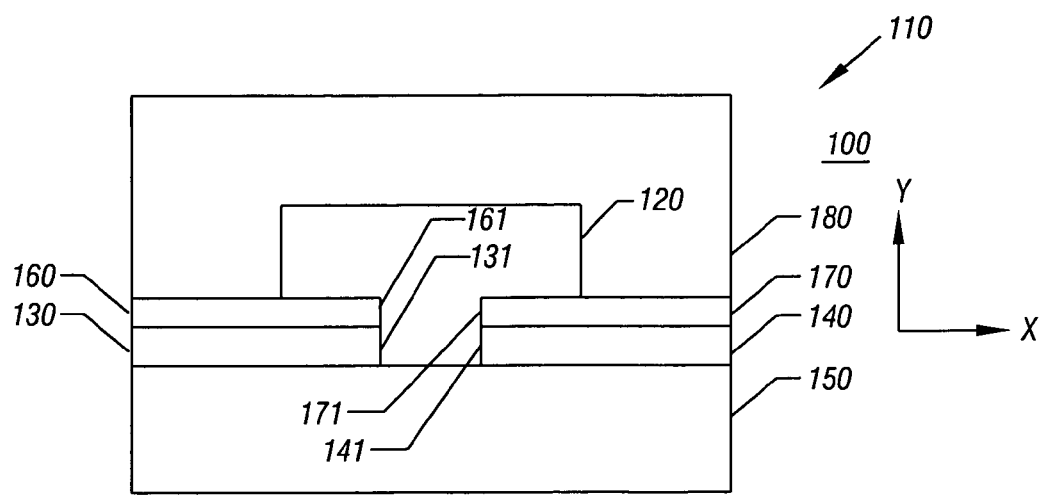
FIG. 1 is a cross-sectional view of a portion of a phase change memory in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, an embodiment of a portion of a phase change memory 100 is illustrated. Phase change memory 100 may comprise a memory element 110 that may include a phase change material 120, wherein at least a portion of phase change material 120 is positioned between two electrodes 130 and 140. Electrodes 130 and 140 may be formed on a dielectric material 150, which may be referred to as a base material in this example. Insulators 160 and 170 may be formed on electrodes 130 and 140, respectively. A dielectric layer 180 may be formed on portions of phase change material 120 and insulators 160 and 170.

It should be noted that the scope of the present invention is not limited by the particular arrangement or structure of phase change memory 100. In alternative embodiments, phase change memory 100 may be arranged differently and include additional layers and structures. For example, it may be desirable to form isolation structures, address lines, peripheral circuitry (e.g., addressing circuitry), etc. It should be understood that the absence of these elements is not a limitation of the scope of the present invention. FIG. 1 has been simplified to illustrate how phase change material 120 may be formed between electrodes 130 and 140.

Electrodes 130 and 140 may be formed from a single layer of conductive material deposited on a dielectric layer. FIGS. 2–4 may be used to illustrate to an embodiment for fabricating memory element 110, wherein electrodes 130 and 140 (FIG. 1) may be formed from a single layer of conductive material 230 (FIG. 2). In one embodiment, electrodes 130 and 140 may be separated from each other by a sub-lithographic distance. For example, in one embodiment, electrodes 130 and 140 may be separated by a distance of less than about 1000 angstroms, although the scope of the present invention is not limited in this respect. In addition, FIGS. 2–4 may be used to illustrate the formation of insulators 160 and 170 (FIG. 1) from a single layer of dielectric material 240 (FIG. 2), wherein insulators 160 and 170 may be separated from each other by a sub-lithographic distance.

A sub-lithographic distance may refer to a distance that is less than a feature size of a structure. The feature size of a structure may refer to the minimum dimension achievable using photolithography. For example, the feature size may refer to a width of a material or spacing of materials in a structure. As is understood, photolithography refers to a process of transferring a pattern or image from one medium to another, e.g., as from a mask to a wafer, using ultra-violet (UV) light. The minimum feature size of the transferred pattern may be limited by the limitations of the UV light. Distances, sizes, or dimensions less than the feature size may be referred to as sub-lithographic distances, sizes, or dimensions. For example, some structures may have feature sizes of about 2500 angstroms. In this example, a sub-lithographic distance may refer to a feature having a width of less than about 2500 angstroms.

Several techniques may be used to achieve sub-lithographic dimensions. Although the scope of the present invention is not limited in this respect, phase shift mask, electron beam lithography, or x-ray lithography may be used to achieve sub-lithographic dimensions. Electron beam lithography may refer to a direct-write lithography technique using a beam of electrons to expose resist on a wafer. X-ray lithography may refer to a lithographic process for transferring patterns to a silicon wafer in which the electromagnetic radiation used is X-ray, rather than visible radiation. The shorter wavelength for X-rays (e.g., about 10–50 angstroms, versus about 2000–3000 angstroms for ultra-violet radiation) may reduce diffraction, and may be used to achieve feature sizes of about 1000 angstroms. Also, sidewall spacers may be used to achieve sub-lithographic dimensions. FIGS. 2–4 may be used to illustrate the use of sidewall spacers to achieve sub-lithographic dimensions.

Turning to FIG. 2, conductive material 230 may be formed on dielectric material 150. Dielectric material 150 may be formed from a variety of materials such as, for example, silicon dioxide, silicon nitride, or other material. As an example, conductive material 230 may be formed on dielectric material 150 using a physical vapor deposition (PVD) process. Conductive material 230 may be carbon or a semi-metal such as a transition metal, including but not limited to titanium, tungsten, titanium nitride (TiN) or titanium aluminum nitride (TiAlN). Another suitable electrode material may include a polycrystalline semiconductor material such as polycrystalline silicon, although the scope of the present invention is not limited in this respect. Conductive material 230 may have a thickness ranging from about 50 angstroms to about 250 angstroms, although the scope of the present invention is not limited in this respect.

After the formation of conductive layer 230, a layer of dielectric material 240 may be formed on conductive material 230 using a chemical vapor deposition (CVD) process. Dielectric material 240 may be silicon dioxide, silicon nitride, or other dielectric material. Dielectric material 240 may have a thickness ranging from about 25 angstroms to about 500 angstroms, although the scope of the present invention is not limited in this respect.

Another layer of dielectric material 250 such as, for example, an oxide or oxide nitride, may be formed on dielectric material 240. An opening 255 having sidewalls 256 may be formed by etching dielectric material 250. Opening 255 may be a via or a trench, although the scope of the present invention is not limited in this respect. As an example, opening 255 may be formed by applying a layer of photoresist material (not shown) on dielectric material 250 and exposing this photoresist material to light. A mask (not shown) may be used to expose selected areas of the photoresist material, which defines areas to be removed, i.e., etched. The etch may be a chemical etch, which may be referred to as a wet etch. Or, the etch may be an electrolytic or plasma (ion bombardment) etch, which may be referred to as a dry etch. If opening 255 is formed using photolithographic techniques, the diameter or width of opening 255 may be at least one feature size.

FIG. 3 illustrates the structure of FIG. 2 after the conformal introduction of a dielectric material 260. Dielectric material 260 may be formed over dielectric material 250, along sidewalls 256, and on a portion of dielectric material 240. Suitable materials for dielectric material 260 may include silicon dioxide, silicon nitride, or polysilicon, although the scope of the present invention is not limited in this respect.

Dielectric material 260 may have a smaller thickness compared to dielectric material 250. By way of example, dielectric material 260 may have a thickness ranging from about one-sixth ($1/6$) of a feature size to about one-third ($1/3$) of a feature size, although the scope of the present invention is not limited in this respect. As may be appreciated, the introduction of dielectric material 260 reduces opening 255 (FIG. 2). A smaller opening, i.e., opening 265 may be formed using dielectric material 260. The width of opening 265 is less than the width of opening 255, and may be a sub-lithographic width. The portions of dielectric material 260 along sidewalls 256 may be referred to as sidewall spacers 261 and 262. Thus, as may be appreciated, sidewall spacers 261 and 262 may be used to form opening 265 that may have a sub-lithographic width. In one embodiment, the width of opening 255 (FIG. 2) may be about one feature size, and the thickness of dielectric material 260 may be chosen so that the width of opening 265 (FIG. 3) is about one-third the size of opening 255. In one embodiment, the width of opening 265 may be less than about 1000 angstroms, although the scope of the present invention is not limited in this respect.

After dielectric material 260 is formed, portions of materials 230, 240 and 260 may be removed using, e.g., an etch process. FIG. 4 illustrates the structure of FIG. 3 after the patterning of materials 230, 240, and 260. Turning to FIG. 4, in one embodiment, a dry etch such as, for example, an anisotropic etch may be used to remove portions of materials 230, 240 and 260, thereby forming electrodes 130 and 140 from conductive material 230 and forming insulators 160 and 170 from dielectric material 240. In one embodiment, electrodes 130 and 140 may be separated from each other by a sub-lithographic distance and insulators 160 and 170 may be separated from each other by a sub-lithographic distance. The process of forming a sub-lithographic dimension using sidewall spacers illustrated with reference to FIGS. 2–4 may also be referred to as a sub-lithographic etch. Dielectric materials 260 and 250 may be removed after the formation of electrodes 130 and 140, although the scope of the present invention is not limited in this respect.

In one embodiment, after forming of electrodes 130 and 140 and insulators 160 and 170, a phase change material may be disposed between electrodes 130 and 140 and between insulators 160 and 170 as is illustrated in FIG. 1. Or, in an alternate embodiment, more sidewall spacers may be used to reduce the amount of phase change material between electrodes 130 and 140. For example, the thickness of the phase change material in the z-direction (orthogonal to the XY perspective shown in FIG. 1–4) may be reduced by disposing more sidewall spacers prior to the deposition of the phase change material. FIGS. 5–10 may be used to illustrate an embodiment for fabricating memory element 110, wherein sidewall spacers may be used to reduce the space between electrodes 130 and 140 prior to forming phase change material 150 between electrodes 130 and 140.

Figure 5:
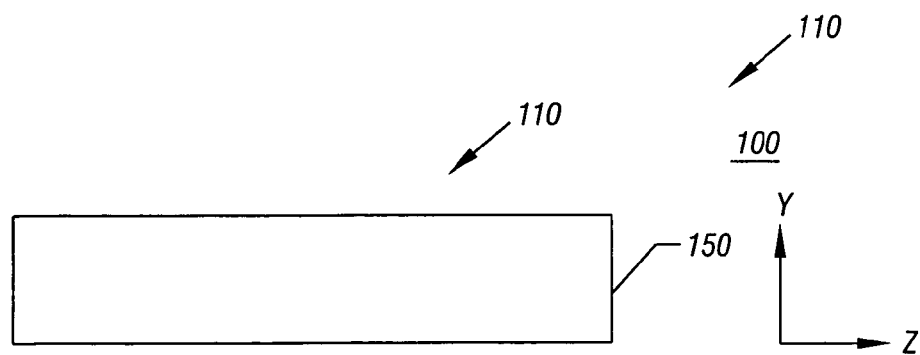
FIG. 5 is a cross-sectional view of the structure of FIG. 4 through line 5—5.

FIG. 5 is a cross-sectional view of memory element 110 through line 5—5 of FIG. 4. FIG. 5 provides a view of memory cell 100 that is orthogonal to the view shown in FIG. 4 (i.e., an ZY perspective) during a later state of fabrication. In FIG. 5, dielectric material 150 is illustrated.

Figure 6:
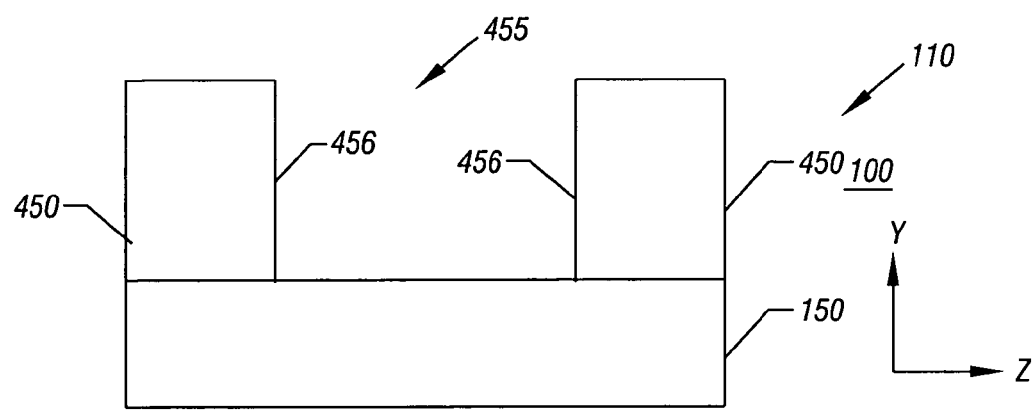
FIG. 6 is a cross-sectional view of the structure of FIG. 5 at a later stage of fabrication.

FIG. 6 illustrates the structure of FIG. 5 after the forming and patterning of a dielectric material 450. In one embodiment, dielectric material 450 may be formed on dielectric material 150 using a CVD process. Suitable materials for dielectric material 450 may include silicon dioxide or a low K dielectric material, although the scope of the present invention is not limited in this respect. Dielectric material 450 may have a thickness ranging from about 1000 angstroms to about 3000 angstroms, although the scope of the present invention is not limited in this respect. An opening 455 having sidewalls 456 may be formed by etching dielectric material 450 using an anisotropic dry etch. Opening 455 may be a via or a trench, although the scope of the present invention is not limited in this respect. If opening 455 is formed using photolithographic techniques, the width of opening 455 may be at least one feature size.

Figure 7:
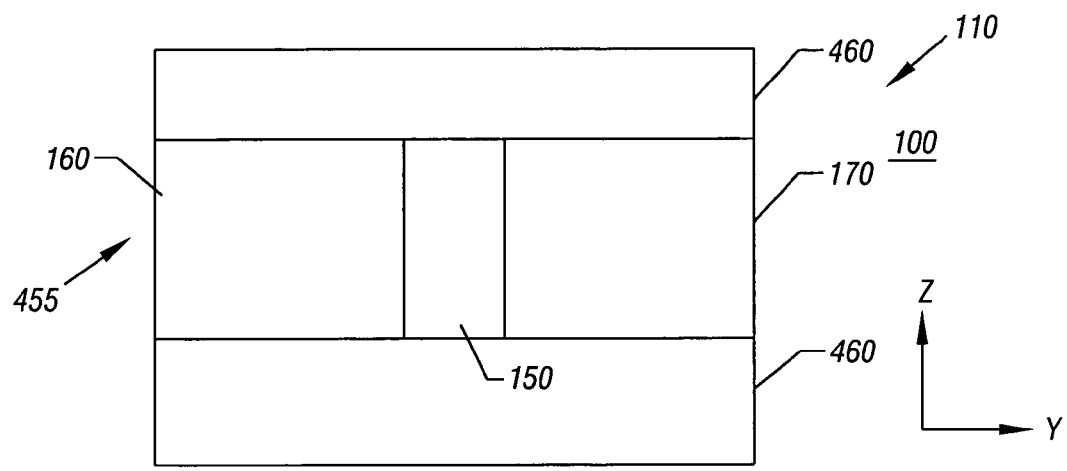
FIG. 7 is a top view of the structure of FIG. 6 at the stage of fabrication illustrated in FIG. 6.

FIG. 7 is a top view of memory element 110 at the stage of manufacture illustrated in FIG. 6. As is seen in FIG. 7, portions of dielectric material 460 may be removed during the etch operation to form opening 455 so that portions of dielectric materials 150, 160, an 170 may be exposed.

Figure 8:
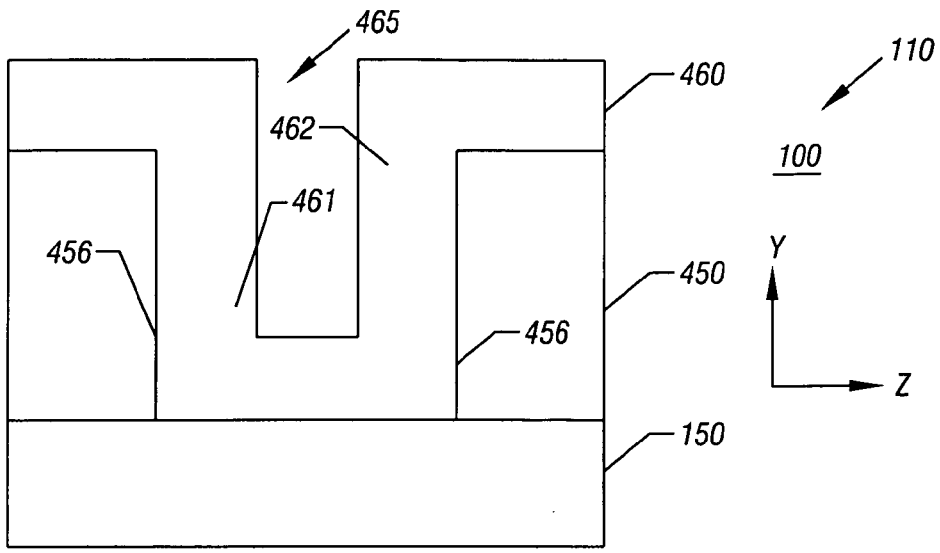
FIG. 8 is a cross-sectional view of the structure of FIG. 6 at a later stage of fabrication.

FIG. 8 illustrates the structure of FIG. 6 after the conformal introduction of a dielectric material 460. Dielectric material 460 may be formed over dielectric material 450 and along sidewalls 456. Suitable materials for dielectric material 460 may include silicon dioxide, silicon nitride, or low K dielectric material, although the scope of the present invention is not limited in this respect. Dielectric material 460 may have a smaller thickness compared to dielectric material 450. By way of example, dielectric material 460 may have a thickness ranging from about one-sixth of a feature size to about one-third of a feature size, although the scope of the present invention is not limited in this respect. An opening 465 may be formed using dielectric material 460. The width of opening 465 may be a sub-lithographic width. The portions of dielectric material 460 along sidewalls 456 may be referred to as sidewall spacers 461 and 462. In one embodiment, the width of opening 455 (FIG. 6) may be about one feature size, and the thickness of dielectric material 460 may be chosen so that the width of opening 465 (FIG. 8) is about one-third the size of opening 455. For example, the width of opening 465, i.e., the distance between sidewall spacers 461 and 462, may be less than about 1000 anstroms.

Figure 9:
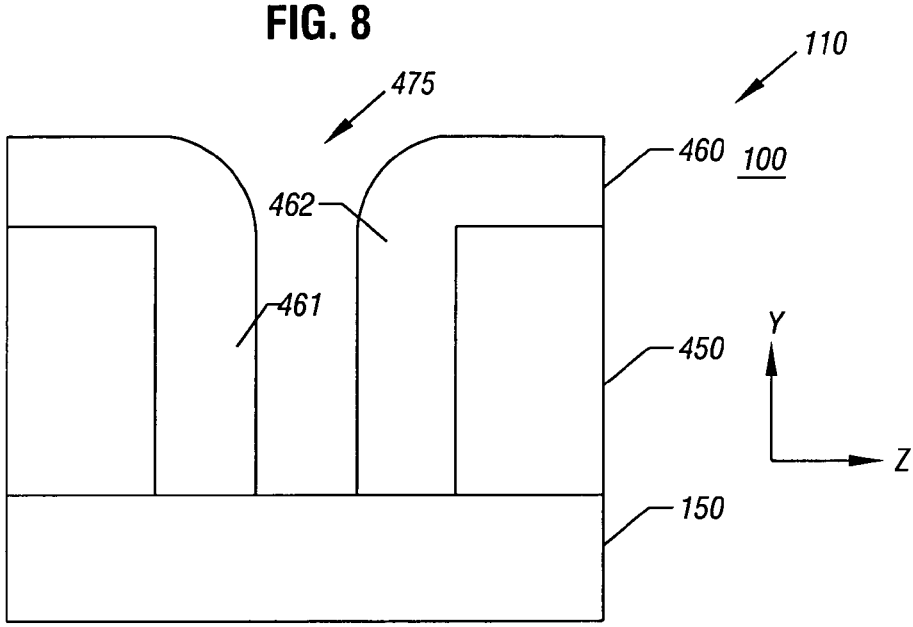
FIG. 9 is a cross-sectional view of the structure of FIG. 8 at a later stage of fabrication.

After dielectric material 460 is formed, dielectric material 460 may be patterned using an etch process. FIG. 9 illustrates the structure of FIG. 8 after the patterning of dielectric material 460. Turning to FIG. 9, in one embodiment, a dry etch such as, for example, an anisotropic etch may be used to form a trench 475 having a sub-lithographic width. In one embodiment, the width of trench 475 may be less than about 1000 angstroms, although the scope of the present invention is not limited in this respect.

Figure 10:
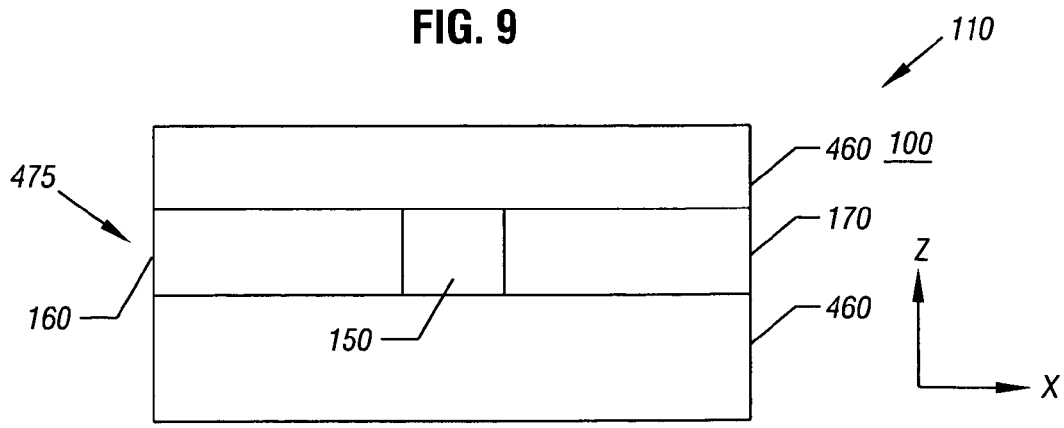
FIG. 10 is a top view of the structure of FIG. 9 at the stage of fabrication illustrated in FIG. 9.

FIG. 10 is a top view of memory element 110 at the stage of manufacture illustrated in FIG. 9. As is seen in FIG. 10, portions of dielectric material 460 may be removed during the etch operation to form trench 475 so that portions of dielectric materials 150, 160, and 170 may be exposed. In one embodiment, after forming trench 475, phase change material 120 may be formed between sidewall spacers 461 and 462, between electrodes 130 and 140, and between insulators 160 and 170.

Figure 11:
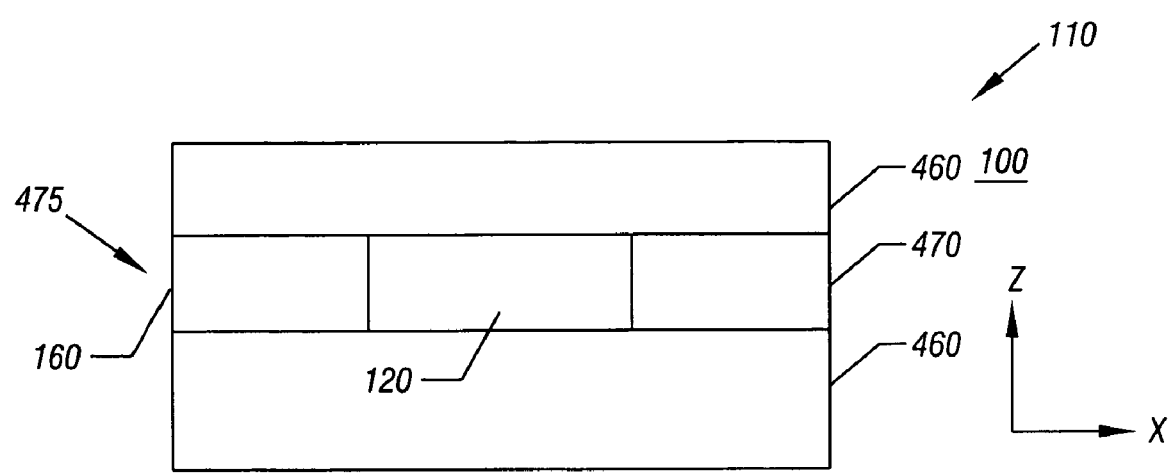
FIG. 11 is a top view of the structure of FIG. 10 at a later stage of fabrication.

FIG. 11 is a top view of the structure of FIG. 10 at a later stage of fabrication. FIG. 11 illustrates memory element 110 after the deposition of phase change material 120 in opening 475, between sidewall spacers 461 and 462, between electrodes 130 and 140, and between insulators 160 and 170.

As may be appreciated, using at least one sub-lithographic process, e.g., sidewall spacers, to form memory element 110 may reduce the amount of space between electrodes 130 and 140 and between insulators 160 and 170, thereby reducing the amount of phase change material between electrodes 130 and 140. As described with reference to FIGS. 2–4, the space between electrodes 130 and 140 where phase change material may be formed may be sub-lithographic in the x-direction. In addition, as described with reference to FIGS. 5–10, the space between electrodes 130 and 140 in the z-direction may also be sub-lithographic.

Referring back to FIG. 1, insulators 160 and 170 may provide electrical and/or thermal isolation. Insulators 130 and 140 may assist in limiting the ohmic contact area between phase change material 120 and electrodes 130 and 140. In the embodiment illustrated in FIG. 1, only a surface or edge 131 of electrode 130 is contacting a portion of phase change material 120. In addition, only a surface or edge 141 of electrode 140 is contacting phase change material 120. Also shown in FIG. 1, edge 161 of insulator 160 may be continuous and aligned to edge 131 of electrode 130 and edge 171 of insulator 170 may be continuous and aligned to edge 141.

Although memory element 110 is illustrated with insulators 160 and 170, this is not a limitation of the present invention. In alternate embodiments, memory element 110 may be formed without insulators 160 and 170. As discussed above, in one embodiment, the same etching operation may be used to form insulators 160 and 170 and electrodes 130 and 140. In another embodiment, separate etching operations may be used to form insulators 160 and 170 and electrodes 130 and 140.

After forming electrodes 130 and 140 and insulators 160 and 170, phase change material 120 may be formed between insulators 160 and 170, between electrodes 130 and 140, and overlying a portion of insulators 160 and 170. Portions of phase change material 120 may be in electrical communication with portions of electrodes 130 and 140. Examples of phase change material 150 include, but are not limited to, chalcogenide element(s) compositions of the class of tellurium-germanium-antimony (TexGeySbz) material or GeSbTe alloys, although the scope of the present invention is not limited to just these. Alternatively, another phase change material may be used whose electrical properties (e.g. resistance, capacitance, etc.) may be changed through the application of energy such as, for example, light, heat, or electrical current.

After forming phase change material 120, a dielectric material 180 may be formed over phase change material 120 and insulators 160 and 170. Although the scope of the present invention is not limited in this respect, dielectric material 180 may be silicon dioxide, silicon nitride, or other material. Dielectric material 180 may be referred to as an encapsulator.

Programming of phase change material 120 to alter the state or phase of the material may be accomplished by applying voltage potentials to electrodes 130 and 140. For example, a voltage potential difference of less than about five volts may be applied across the phase change material 120 by applying about five volts to electrode 140 and about zero volts to electrode 130. A current may flow through the phase change material in response to the applied voltage potentials, and may result in heating of phase change material 120 and electrodes 130 and 140. This heating may alter the memory state or phase of phase change material 120.

The voltage potentials needed to transition phase change material 120 from one state to another may be directly proportional to the distance between electrodes 130 and 140. Accordingly, decreasing the distance between electrodes 130 and 140 may also decrease the voltage potentials needed to transition phase change material 120 from one memory state to another memory state. For example, in one embodiment, if the distance between electrodes 130 and 140 is approximately 1000 angstroms, a voltage potential difference of about two volts may be applied across the portion of phase change material 120 between electrodes 130 and 140 to induce a current to heat these materials. This voltage and current may be sufficient to alter the state of phase change mater from a generally amorphous state to a generally crystalline state. Reducing the voltage and current used during operation of memory element 110 may also reduce power consumption of phase change memory 100.

As discussed above, insulators 160 and 170 may limit the contact area between phase change material 120 and electrodes 130 and 140. By limiting the contact area between phase change material 120 and electrodes 130 and 140, this reduces the volume of phase change material 120 that is subject to programming. In other words, the region of programming to store information, i.e., the region of phase change material 120 subject to state or phase transitions in response to applied voltage potentials, is confined to a portion of phase change material 120 which is less than the total volume. Without insulators 160 and 170, the contact area between phase change material 120 and electrodes 130 and 140 is increased. This may increase the region of programming, which may increase the voltage/current needed to program phase change material 120.

The region of programming may be further limited by reducing the amount of phase change material between electrodes 130 and 140 in both the x-direction and z-direction using sub-lithographic techniques as discussed above. Accordingly, a smaller portion of phase change material is subject to programming, which may decrease the amount of voltage/current needed to program phase change material 120.

Dielectric materials 150 and 180 may be used to provide electrical and/or thermal isolation for memory element 110. In addition to the examples described above, dielectric materials 150 and 180 may also be low K dielectric materials. The thickness and the technique used to formed these dielectric materials may be selected depending on the desired characteristics of memory element 110. By providing this insulation and confining the region of programming, the efficiency for programming phase change material 120 using electrical heating may be increased.

Memory element 110 may be referred to as a lateral phase change memory device since current flows laterally, i.e., in a horizontal or the x-direction. As is illustrated in FIG. 1, electrodes 130 and 140 may be formed under portions of phase change material. Alternatively, some phase change memories (not shown) may use memory cells having a vertical configuration, wherein electrodes are placed above and below the phase change material so that electrical current flows in a vertical direction.

Although the scope of the present invention is not limited in this respect, in some embodiments, electrodes 130 and 140 may be symmetric in size and formed from the same material using the same processing operations, thereby decreasing the cost and complexity of fabricating memory element 110. Electrodes 130 and 140 may be deposited prior to depositing phase change material 120, and therefore, electrodes 130 and 140 may be prepared at higher temperatures compared to the temperatures used to prepare phase change material 120. In addition, in the embodiment illustrated in FIG. 1, a relatively large portion of phase change material 120 may be surrounded by insulators and a relatively small portion of electrodes 130 and 140 may contact phase change material 120. Accordingly, the structure illustrated in FIG. 1 may result in a relatively low power memory element. Also, if electrodes 130 and 140 are symmetric in size, then these electrodes may contribute equally to the heating of phase change material 120 during programming, which may increase the efficiency and reliability of memory element 110.

Figure 12:
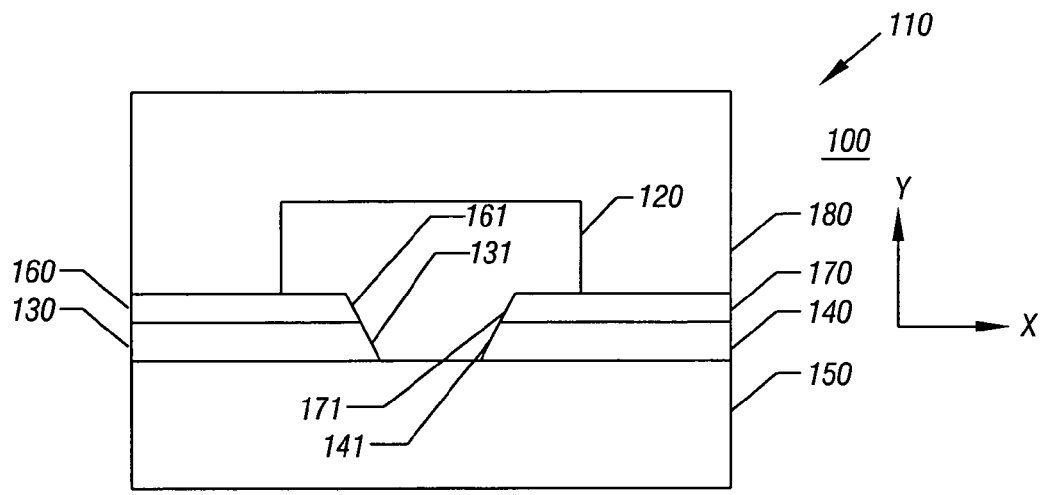
FIG. 12 is a cross-sectional view of a portion of a phase change memory in accordance with another embodiment of the present invention.

Turning to FIG. 12, another embodiment of memory element 110 is illustrated. In this embodiment, insulator 160 and electrode 130 may be removed (e.g., etched) or patterned so that an edge 161 of insulator 160 is beveled and an edge 131 of electrode 130 is beveled, and wherein edge 161 of insulator 160 and edge 131 of electrode 130 are coplanar and contiguous. In other words, edges 131 and 161 are angled with respect to dielectric material 150. In addition, insulator 170 and electrode 140 may be patterned so that an edge 171 of insulator 170 is beveled and an edge of electrode 140 is beveled, and wherein edge 171 of insulator 170 and edge 141 of electrode 140 are coplanar and contiguous. Forming electrodes 130 and 140 and insulators 160 and 170 in this fashion may improve the contact between phase change material 120 and electrodes 130 and 140.

Figure 13:
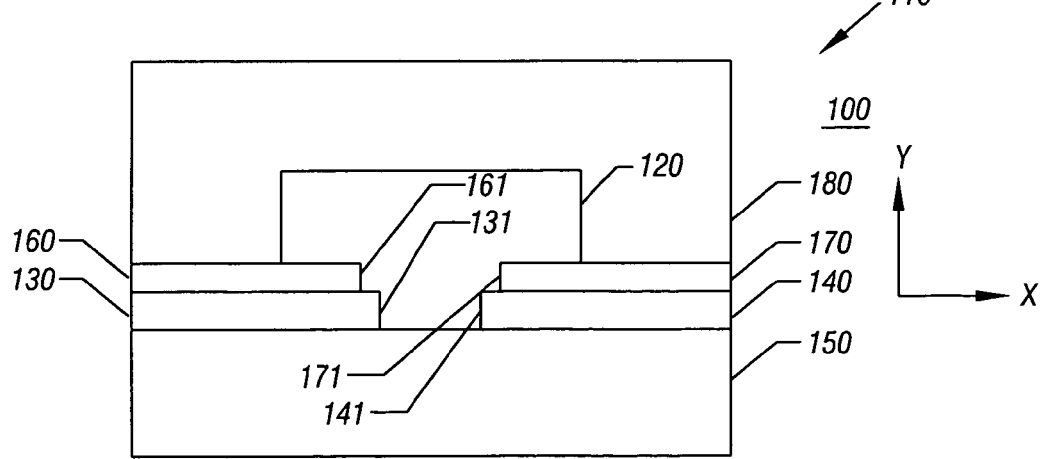
FIG. 13 is a cross-sectional view of a portion of a phase change memory in accordance with another embodiment of the present invention.

Turning to FIG. 13, another embodiment of memory element 110 is illustrated. In this embodiment, insulator 160 and electrode 130 may be patterned (e.g., etched) so that edge 161 of insulator 160 is noncontiguous and not aligned to edge 131 of electrode 130. For example, the etch operation used to form insulator 160 and electrode 130 may be modified so that insulator 130 is etched further than electrode 130. In addition, insulator 170 may be etched further than electrode 140 so that edge 171 of insulator 170 is noncontiguous and not aligned to edge 141 of electrode 140. Forming electrodes 130 and 140 and insulators 160 and 170 in this fashion may improve the contact between phase change material 120 and electrodes 130 and 140.

Figure 14:
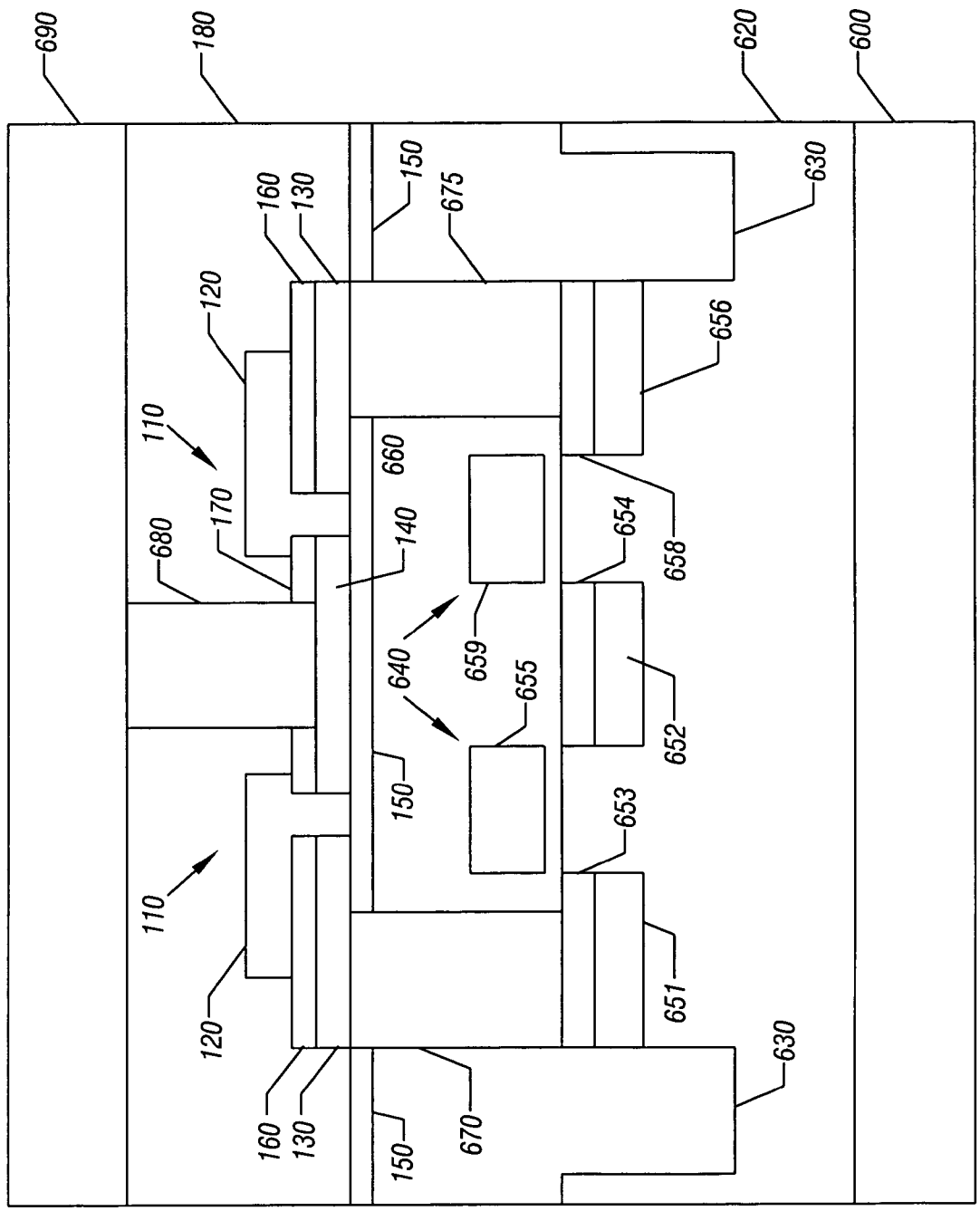
FIG. 14 is a cross-sectional view of a portion of a phase change memory in accordance with another embodiment of the present invention.

Turning to FIG. 14, an embodiment of phase change memory 100 is illustrated. Phase change memory 100 includes memory elements 110. Phase change memory 100 may also include additional structures such as switching or select devices (e.g., transistors or diodes), isolation structures, and address lines.

In the embodiment illustrated in FIG. 14, phase change memory 100 comprises a substrate 600 that may be formed from a semiconductor material. In this embodiment, a P-type dopant such as, for example, boron may be introduced in substrate 600. In one example, although the scope of the present invention is not limited in this respect, a suitable concentration of P-type dopant is on the order of above about $5 \times 10^{18}$ to about $1 \times 10^{20}$ atoms per cubic centimeters (atoms/cm$^3$), rendering substrate 600 representatively P++. Overlying substrate 600, in this example, may be P-type epitaxial silicon 620. In one example, the dopant concentration is on the order of about $10^{15}$ to $10^{17}$ atoms/cm$^3$.

Phase change memory 100 may also include shallow trench isolation (STI) structures 630 formed in epitaxial silicon 620. STI structures 630 may serve to isolate individual memory elements from one another as well as associated circuit elements (e.g., transistor devices) formed in and on the substrate. In one embodiment, STI structure 630 may be silicon dioxide, although the scope of the present invention is not limited in this respect.

Phase change memory 100 may further include select devices 640 that may be part of the address circuitry. Select devices 640 may be two metal-oxide semiconductor field effect transistors (MOSFETs). One transistor may include regions 651 and 652, conductive materials 653 and 654, and a gate 655. The other transistor may include a regions 652 and 656, conductive materials 654 and 658, and a gate 659.

Regions 651, 652, and 656 may be N-type doped polysilicon formed by the introduction of, for example, phosphorous or arsenic to a concentration on the order of about $10^{18}$ to about $10^{20}$ atoms/cm$^3$ (e.g., N+ silicon), although the scope of the present invention is not limited in this respect. Conductive materials 653, 654, and 658 may be, in one example, a refractory metal silicide such as cobalt silicide (CoSi$_2$). Conductive materials 653, 654, and 658, in one aspect, may serve as a low resistance material in the fabrication of peripheral circuitry (e.g., addressing circuitry) of the circuit structure on the chip. Conductors 652 and 654 together serve as the wordline row (eg. Row 820 in FIG. 15).

Gates 655 and 659 of select devices 640 may be formed, in one example, from a polysilicon material. In this example, gates 655 and 659 may be referred to as a signal line or an address line. Gates 655 and 659 may also be referred to as a column line (e.g., column lines 815 of FIG. 15).

A dielectric material 660 such as, for example, SiO2, may be formed surrounding gates 655 and 659. Conductive contacts 670, 675, and 680 may be formed from a conductive material such as, for example, tungsten. Contacts 670 and 675 may be lines that connect transistor 850 to electrode material 860 in FIG. 15. Contact 680 and 690 may be the voltage supply line 830 in FIG. 15. Conductor 690 may be formed from a conductive material, such as, for example, aluminum.

It should be noted that the order or sequence of the operations described above to form memory 100 is not a limitation of the present invention.

Figure 15:
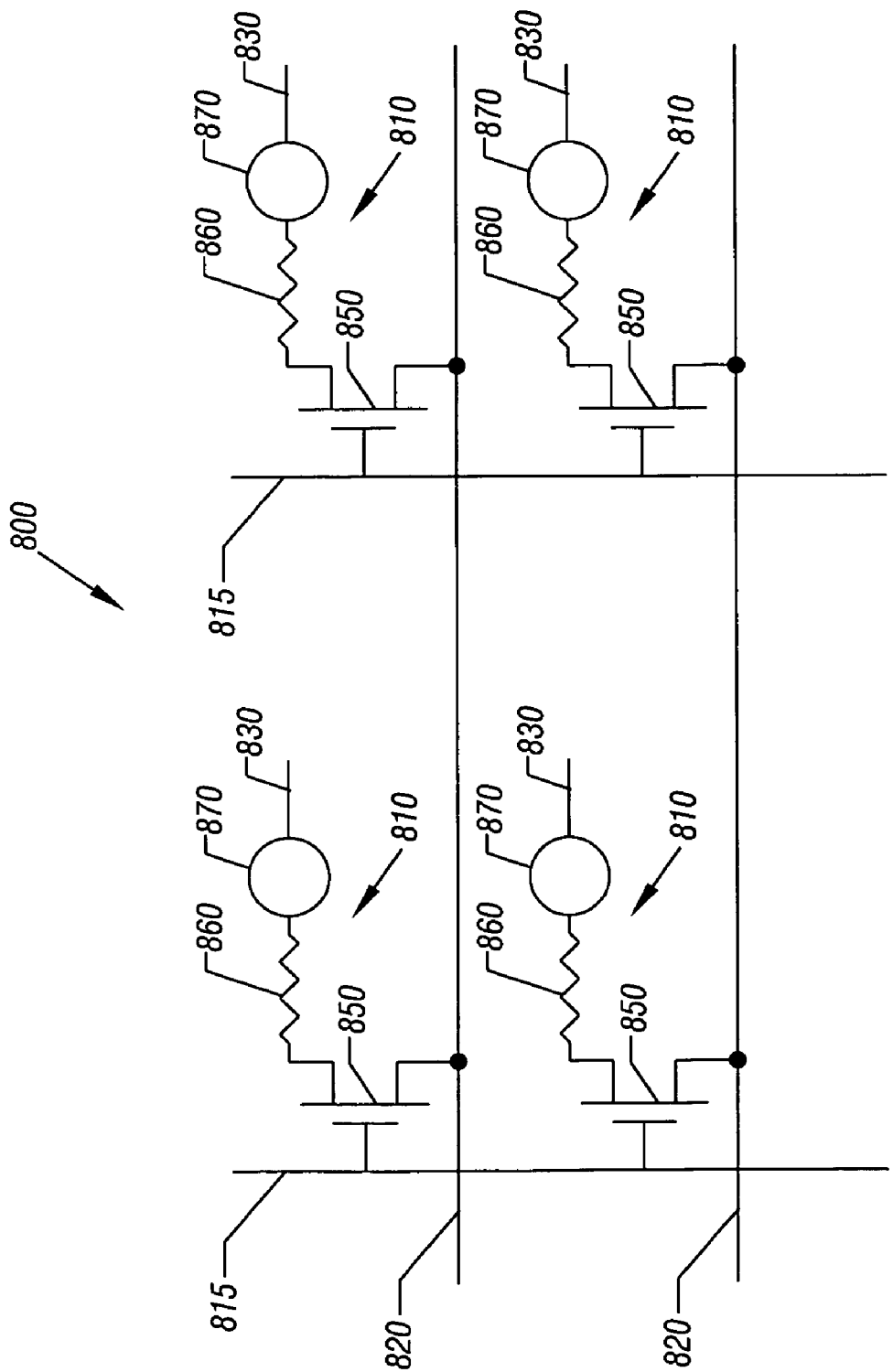
FIG. 15 is a schematic diagram illustrating a memory array in accordance with an embodiment of the present invention.

FIG. 15 is a schematic diagram of an embodiment of a memory array 800. Memory array 800 may include a plurality of phase change memory elements 810 that may be formed as memory element 110 described above. In this example, the circuit of memory array 800 includes address lines 815, 820, and 830 that may be used to program or read memory elements 810. Address lines 815, 820, and 830 may be coupled, in one embodiment, to external addressing circuitry (not shown). Memory elements 810 may comprise a MOSFET 850, a resistor 860, and a phase change material 870.

Figure 16:
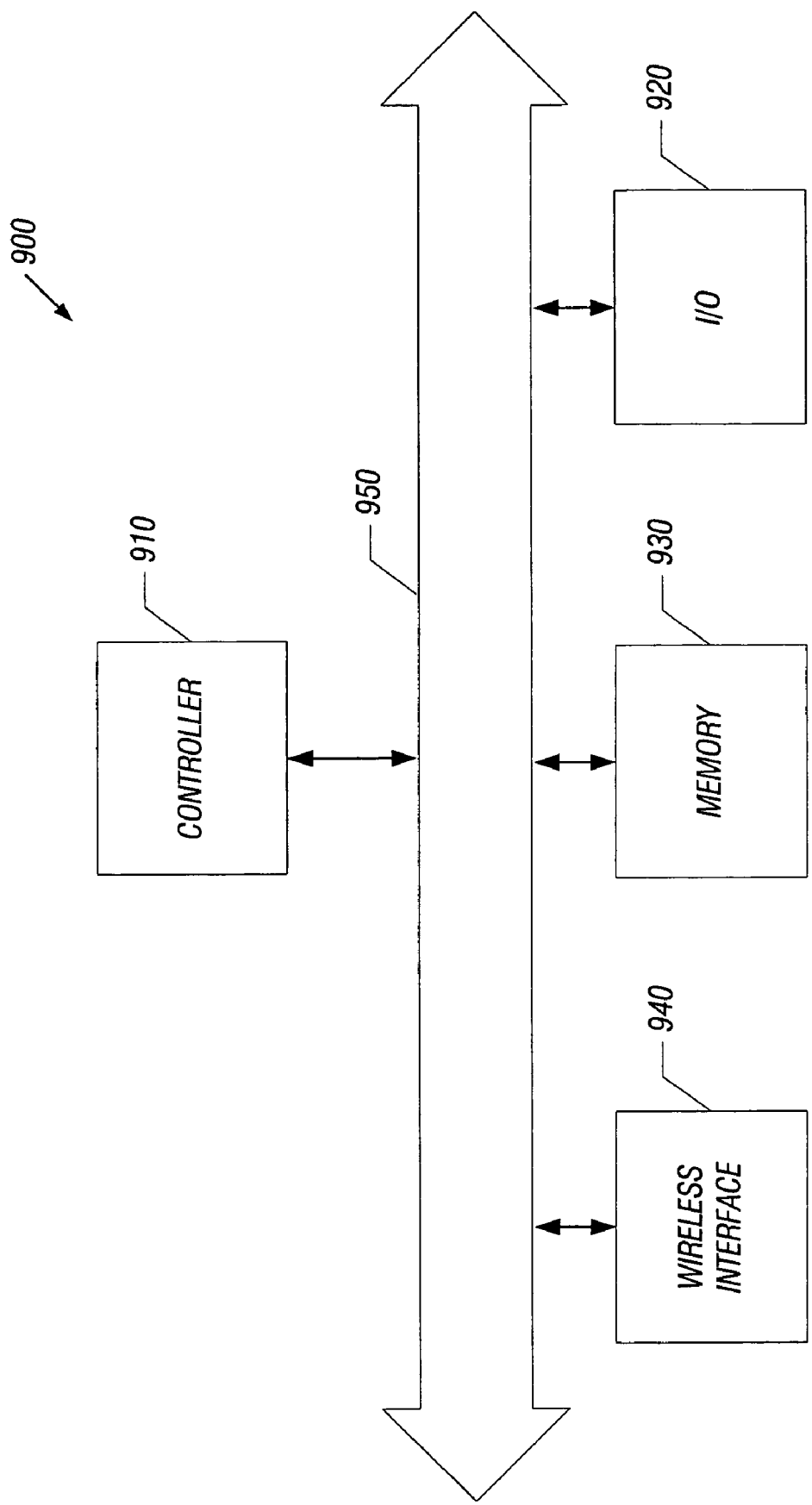
FIG. 16 is a block diagram illustrating a portion of a system in accordance with an embodiment of the present invention.

Turning to FIG. 16, a portion of a system 900 in accordance with an embodiment of the present invention is described. System 900 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly.

System 900 may include a controller 910, an input/output (I/O) device 920 (e.g. a keypad, display), a memory 930, and a wireless interface 840 coupled to each other via a bus 950. It should be noted that the scope of the present invention is not limited to embodiments having any or all of these components.

Controller 910 may comprise, for example, one or more microprocessors, digital signal processors, microcontrollers, or the like. Memory 930 may be used to store messages transmitted to or by system 900. Memory 930 may also optionally be used to store instructions that are executed by controller 910 during the operation of system 900, and may be used to store user data. Memory 930 may be provided by one or more different types of memory. For example, memory 930 may comprise a volatile memory (any type of random access memory), a non-volatile memory such as a flash memory and/or a phase change memory such as, for example, phase change memory 100 illustrated in FIGS. 1, 12,13, or 14.

I/O device 920 may be used by a user to generate a message. System 900 may use wireless interface 940 to transmit and receive messages to and from a wireless communication network with a radio frequency (RF) signal. Examples of wireless interface 940 may include an antenna or a wireless transceiver, although the scope of the present invention is not limited in this respect.

Although the scope of the present invention is not limited in this respect, system 900 may use one of the following communication air interface protocols to transmit and receive messages: Code Division Multiple Access (CDMA), cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A method, comprising:
    forming a conductor material over a substrate;
    removing a portion of the conductor material to form two electrodes from the conductor material, wherein the two electrodes are separated by a sub-lithographic distance; and
    forming a phase change material between the two electrodes.

2. The method of claim 1, wherein removing includes etching the conductor material to form the two electrodes.

3. The method of claim 1, further comprising forming a first dielectric material between a portion of the phase change material and a portion of a first electrode of the two electrodes, wherein a second portion of the first electrode contacts a second portion of the phase change material.

4. The method of claim 3, further comprising removing a portion of the first dielectric material and the first electrode so that an edge of the first dielectric material is beveled and an edge of the first electrode is beveled, and wherein the edge of the first dielectric material and the edge of the first electrode are coplanar.

5. The method of claim 3, further comprising removing a portion of the first dielectric material and the first electrode so that an edge of the first dielectric material is noncontiguous to an edge of the first electrode.

6. The method of claim 3, further comprising forming a second dielectric material over the first dielectric material, and removing a portion of the second dielectric material to form a first opening having a sidewall to expose a portion of the first dielectric material.

7. The method of claim 6, further comprising:

disposing a third dielectric material in the first opening and along the sidewall to form a second opening, wherein the second opening has a sub-lithographic width.

8. The method of claim 6, further comprising:

disposing a third dielectric material in the first opening and along the sidewall of the first opening to form two sidewall spacers, wherein the two spacers are separated by a sub-lithographic distance.

9. The method of claim 8, wherein forming a phase change material includes forming the phase change material between the two spacers.

10. The method of claim 1, further comprising:

coupling a first electrode of the two electrodes to a first address line; and coupling a second electrode of the two electrodes to a second address line.

* * * * *